United States Patent [19]

Hynecek

[11] Patent Number: 5,101,174
[45] Date of Patent: Mar. 31, 1992

[54] ADVANCED CHARGE DETECTION AMPLIFIER FOR HIGH PERFORMANCE IMAGE SENSORS

[75] Inventor: Jaroslav Hynecek, Richardson, Tex.

[73] Assignee: Texas Instruments Incorporated, Dallas, Tex.

[21] Appl. No.: 607,015

[22] Filed: Oct. 31, 1990

[51] Int. Cl.[5] .............................................. H03F 3/26
[52] U.S. Cl. ..................................... 330/264; 330/267
[58] Field of Search ...................... 307/355, 497, 296.6, 307/296.8; 330/264, 277, 288, 296, 307, 308, 311, 273, 269, 267

[56] References Cited

U.S. PATENT DOCUMENTS

| | | | |
|---|---|---|---|
| 3,983,413 | 9/1976 | Gunsager et al. | 307/355 X |
| 4,007,381 | 2/1977 | Mahsen | 307/355 X |
| 4,814,648 | 3/1989 | Hynecek | 307/355 X |

*Primary Examiner*—Steven Mottola
*Attorney, Agent, or Firm*—B. Peter Barndt; Richard Donaldson; William E. Hiller

[57] ABSTRACT

A charge detection amplifier embodying the invention comprises a first amplification stage (Q10-Q15) coupled to an input terminal 70 and having an output node 72. Capacitive feedback is provided by a capacitor 82 coupled between an input node 71 and said output node 72. The operating bias point of said first amplification stage is set by a first balance circuit (Q16/Q17) coupled between said output node 72 and two internal nodes 74,76 of said first amplification stage, the magnitude of said coupling being controlled by a voltage applied to a first balance circuit input terminal 84. A first buffer stage 200 is provided to couple said output node 72 to a circuit output terminal 92 and to provide adequate current to drive an external load connected to said output terminal 92. A reset switch (Q24/Q25) is provided to short circuit said capacitor 82 in response to a signal applied to a reset terminal 104.

14 Claims, 3 Drawing Sheets

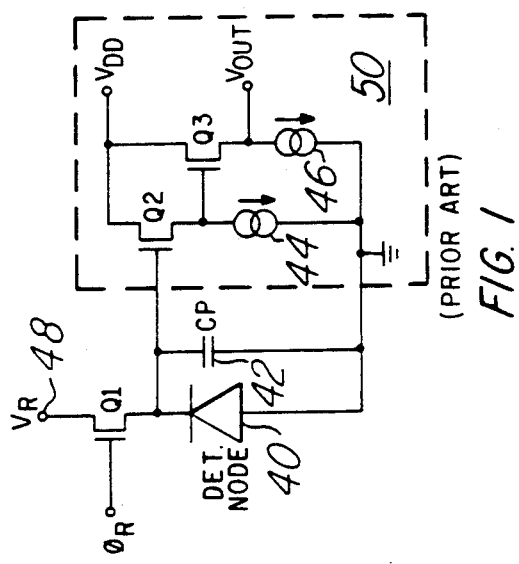
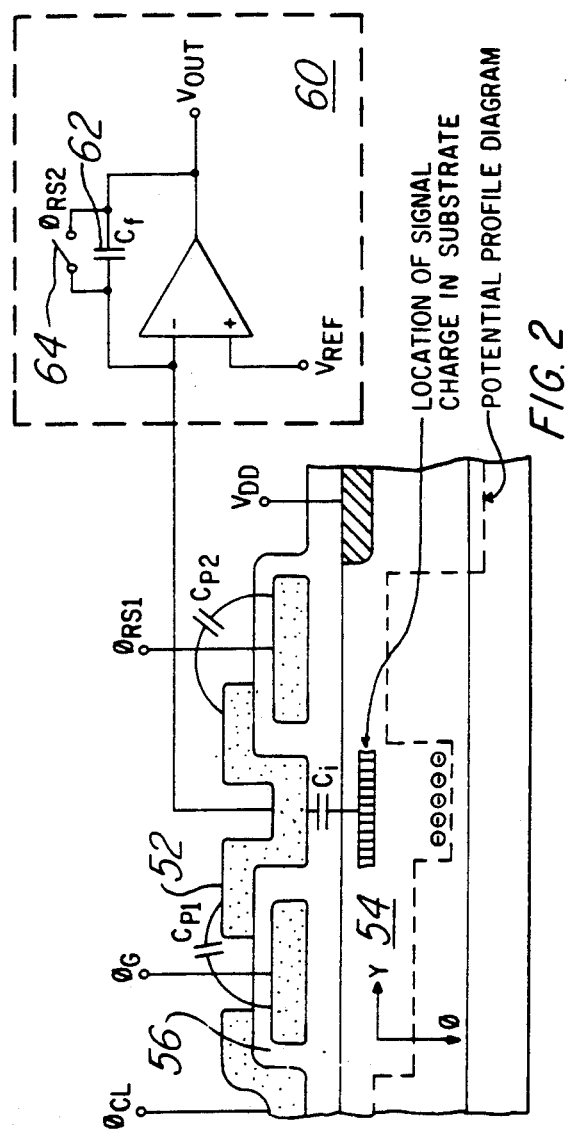
FIG. 1 (PRIOR ART)
FIG. 2

ADVANCED CHARGE DETECTION AMPLIFIER FOR HIGH PERFORMANCE IMAGE SENSORS

FIELD OF THE INVENTION

This invention relates to amplifier circuits and more particularly to amplifier circuits which minimize kTC noise and the undesirable effects of parasitic capacitance.

BACKGROUND OF THE INVENTION

In order to increase the sensitivity and decrease the size of charge-coupled device (CCD) image sensors, the individual photosites that the arrays are designed with are made to be smaller. This smaller size allows for more photosites within the image area (i.e. higher density, higher resolution) and consequently a smaller amount of semiconductor substrate is required for any particular size array.

A necessary consequence of this reduction in scale is the fact that during the device's integration time, less charge will be accumulated in any individual photosite due to the fact that its photon collection area comprises a smaller portion of the entire image array.

Essential to good low noise performance of a CCD image sensor is the charge detection amplifier which converts the charge stored at an individual photosite into a signal of adequate magnitude for further processing. Typical charge conversion sensitivity in conventionally available sensors ranges from approximately 4.0 to 10.0 microvolts per electron. This performance level is unsatisfactory for image sensors having high density photosite arrays in which the charge accumulated in each photosite may be only a few tens of electrons.

Referring to FIG. 1, a prior art charge detection amplifier is shown. The circuit consists of a detection node 40 (typically a reverse biased n-p junction), a reset element Q1, reference voltage terminal 48, and dual stage source follower 50 consisting of transistors Q2 and Q3 and constant current sources 44 and 46. Capacitor 42 represents the total parasitic capacitance and includes the diode capacitance of the CCD detection node as well as the input capacitance of the source follower 50 ($C_{GD}$, $C_{GS}$, etc.). Even though this circuit has been used widely and is simple, it has the disadvantages of no voltage gain (source follower $A_v$ is typically around 0.7), low charge conversion factor (due to the parasitic capacitance $C_p$), and large kTC noise due to the reset requirement of the detection node and large parasitic capacitance $C_p$. To minimize the undesirable effects of the large kTC noise necessitates complex signal processing, a clearly undesirable consequence.

SUMMARY OF THE INVENTION

It is herein recognized that a need exists for a charge conversion amplifier with greater than unity voltage gain, high charge conversion factor (sensitivity), lower kTC noise, adjustable bias point, low sensitivity to parasitic capacitances, and improved linearity. The present invention is directed towards meeting those needs.

A charge detection amplifier embodying the invention comprises a first amplification stage coupled to an input terminal and having an output node. Capacitive feedback is provided by a capacitor coupled between said input terminal and said output node. The operating bias point of said first amplification stage is set by a first balance circuit coupled between said output node and two internal nodes of said first amplification stage, the magnitude of said coupling being controlled by a voltage applied to a first balance circuit input terminal. A first buffer stage is provided to couple said output node to a circuit output terminal and to provide adequate current to drive an external load connected to said output terminal. A reset switch is provided to short circuit said capacitor in response to a signal applied to a reset terminal.

BRIEF DESCRIPTION OF THE DRAWINGS

The foregoing and further aspects of the invention are illustrated in the accompanying drawings wherein like elements are denoted by like reference designators and in which:

FIG. 1 is a schematic circuit diagram of a known charge detection amplifier.

FIG. 2 is a cross-sectional elevation view of a charge detection node and a schematic circuit diagram of an inverting amplifier with AC feedback.

DETAILED DESCRIPTION OF THE PREFERRED EMBODIMENTS

Figure 3:
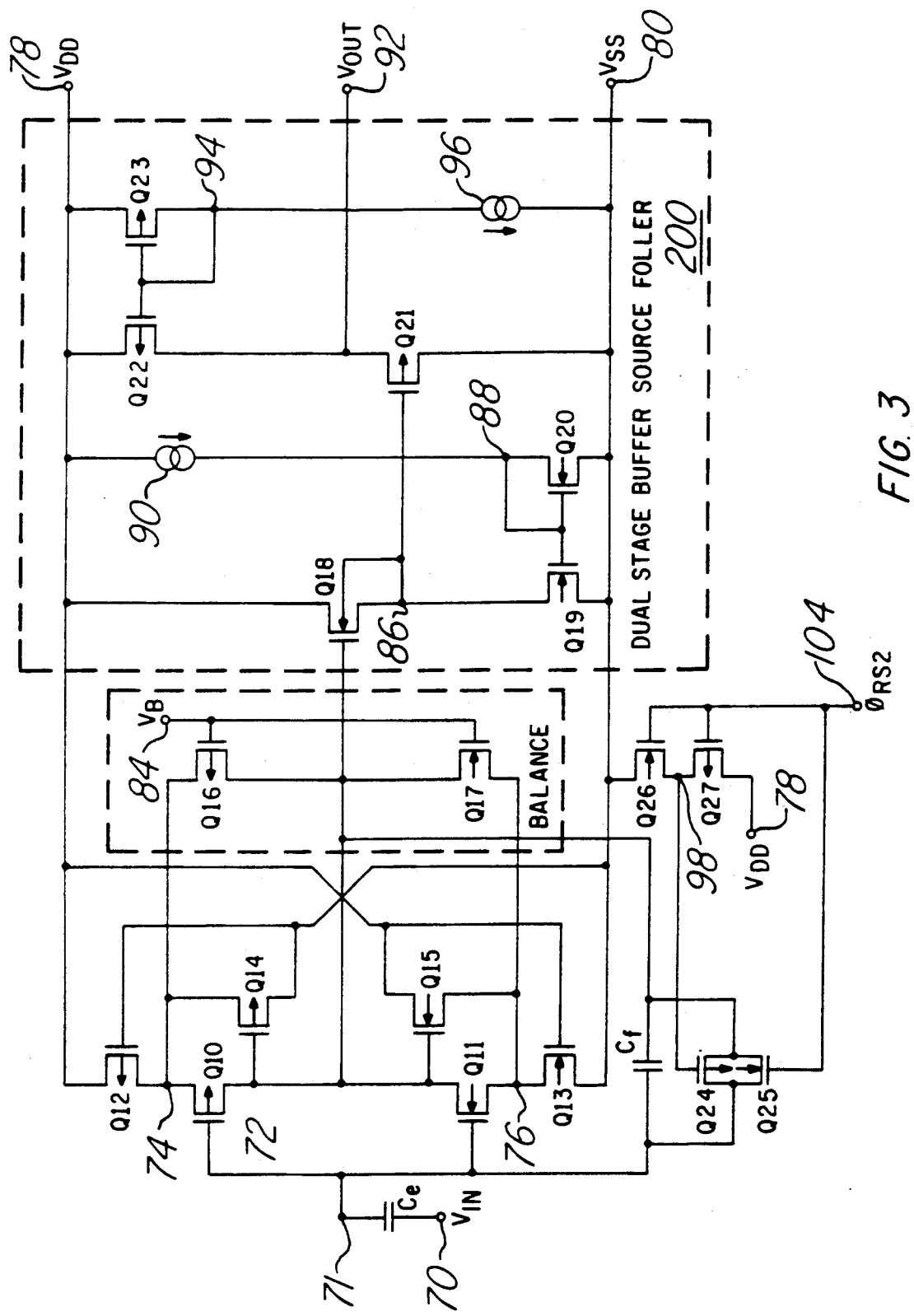
FIG. 3 is a schematic circuit diagram of a first preferred embodiment amplifier of the present invention.

As disclosed in a related application (Ser. No. 682,858, filed on 11/13/89 and assigned to the same assignee as this application), the availability of CMOS circuits integrated on the same substrate with the CCD has made it possible to use the charge sensing concept based on the floating gate principle. As illustrated in FIG. 2, the CCD detection node is no longer a diode junction formed by the direct contact of the input gate with the floating diffusion charge accumulation region, but is rather formed by floating gate 52 separated from n-well charge accumulation region 54 by insulating layer 56. Coupled to floating gate 52 is an inverting amplifier 60 with AC feedback capacitor 62 and reset switch 64. The advantages of this configuration are that there is no charge left in the detection node after reset (complete charge transfer after a positive pulse is applied to $\Phi_{RS1}$) which eliminates kTC noise in the detection node, and the use of an operational amplifier in the inverting configuration with capacitive feedback which reduces (or eliminates) the adverse effects of detection node parasitic capacitances $C_{P1}$ and $C_{P2}$ (and others not explicitly shown in the drawings). This, in turn, impacts image sensor performance by providing: 1) improved sensitivity, since the feedback capacitor 62 may be made very small (and the undesirable effects of $C_P$ are eliminated (canceled)); 2) lower kTC noise, also because feedback capacitor 62 may be made smaller (therefore complex signal processing may not be necessary and processing is simplified at higher clocking rates); 3) adjustable $V_{REF}$, which allows adjustment of device operating bias for best performance; and 4) improved linearity, since the detection node now senses charge directly instead of voltage (the floating gate 52 bias is kept at a constant level equal to $V_{REF}$).

To achieve this performance in CMOS technology, it is necessary to develop a new amplifier with performance requirements of low power consumption, high speed (large bandwidth), adjustable $V_{REF}$, and high open loop gain. The preferred embodiment of the present invention satisfies these requirements.

FIG. 3 illustrates the schematic diagram of a preferred embodiment of the present invention. An input terminal 70 is provided for the application of an input signal and is coupled to the gates of a p-channel transistor Q10 and an n-channel transistor Q11 through a capacitor $C_i$. The capacitor $C_i$ represents the coupling of the charge in the CCD channel to the floating gate 52. Transistor Q10 has a drain coupled to a node 72 and a source connected to a node 74. Transistor Q11 has a drain coupled to node 72 and a source connected to a node 76. A p-channel transistor Q12 has a drain coupled to node 74, a source connected to a supply voltage input terminal 78 for receiving a supply voltage $V_{DD}$, and a gate connected to a further supply voltage input terminal 80 for receiving a supply voltage $V_{SS}$ which is negative with respect to supply voltage $V_{DD}$. An n-channel transistor Q13 has a drain coupled to node 76, a source connected to terminal 80 and a gate coupled to terminal 78. A p-channel transistor Q14 has a source connected to node 74, a drain coupled to terminal 80, and a gate connected to node 72. An n-channel transistor Q15 has a gate coupled to node 72, a drain connected to terminal 78, and a source coupled to node 76. A feedback capacitor 82 is provided between node 72 and input node 71. A first balance transistor (p-channel) Q16 has a gate connected to a bias voltage supply terminal 84, a source coupled to node 74 and a drain connected to node 72. A second balance transistor (n-channel) Q17 has a gate also connected to bias voltage supply terminal 84, a drain coupled to node 72, and a source connected to node 76. An n-channel transistor Q18 has a gate coupled to node 72, a drain connected to terminal 78, and a source coupled to a node 86. The source of transistor Q18 is further tied to its own tank, biasing its p-tank to source potential (the CMOS process used here is a p-well type built in an n-type substrate. All other n-channel transistors are in p-tanks with the tanks tied to $V_{SS}$). An n-channel transistor Q19 has a drain connected to node 86, a source coupled to terminal 80, and a gate connected to a node 88. A constant current source 90 is coupled between terminal 78 and node 88. An n-channel transistor Q20 has a gate connected to node 88, a drain also connected to node 88, and a source coupled to terminal 80. A p-channel transistor Q21 has a gate connected to node 86, a drain coupled to an output terminal 92, and a source connected to terminal 80. A p-channel transistor Q22 has a source coupled to terminal 78, a drain connected to terminal 92, and a gate coupled to a node 94. A p-channel transistor Q23 has a gate and a drain connected to node 94 and a source coupled to terminal 78. A constant current source 96 is coupled between node 94 and terminal 80. A p-channel transistor Q24 has a gate connected to a node 98, a source coupled to a node 71, and a drain connected to a node 72. An n-channel transistor Q25 has a gate coupled to a reset terminal 104, a source connected to node 71, and a drain coupled to node 72. An n-channel transistor Q26 has a gate connected to terminal 104, a drain coupled to terminal 80, and a source connected to node 98. A p-channel transistor Q27 has a gate coupled to terminal 104, a drain connected to node 98, and a source coupled to terminal 78.

In operation, high open loop gain is achieved by employing a small positive feedback in the circuit's first stage. This feedback compensates for the non-ideal source-drain characteristic of MOS transistors Q10 and Q11. The feedback is accomplished through the action of transistors Q14 and Q15 (source followers) and transistors Q12 and Q13, which act as resistors to load Q14 and Q15 and therefore to control the amount of feedback. The larger Q12 and Q13, the smaller the feedback.

The equation describing the gain of this first stage (assuming $R_o$ is an equivalent output resistance and $C_i$ is the equivalent input impedance) is:

$$A = \left(-\frac{C_i}{C_f}\right)\frac{A_o^2 - j\omega R_o(C_f + C_i + C_p) + \omega^2 R_o^2 C_f(C_i + C_p)}{A_o^2 + \omega^2 R_o^2(C_i + C_p)^2}$$

For a balanced design, we have:

$$\left(1 + \frac{C_i}{C_f} + \frac{C_p}{C_f}\right)(1 - \beta A_o) = 0$$

when $\beta A_o = 1$ and
where $\beta =$ a positive feedback constant (a fraction of the output signal)

$$A = \left(-\frac{C_i}{C_f}\right)\frac{A_o - j\omega C_f R_o}{A_o + j\omega(C_i + C_p)R_o}$$

For low frequencies:

$$\omega < \frac{1}{(C_i + C_p)R_o}$$

giving:

$$A = \left(-\frac{C_i}{C_f}\right)$$

Therefore, an ideal response is possible (independent of $C_P$).

Most operational amplifiers use differential transistor input stages, however this reduces dynamic range, increases power consumption and reduces frequency response. Because CCD's require only AC operation of the amplifier, a single ended approach has been chosen for the input stage of the present invention. The single ended approach, however, does have a drawback in that the bias point is not easily controlled, since the bias currents depend upon transistor sizes and threshold voltages, both of which may vary widely with the processing of the device. This problem has been eliminated in the present invention by the use of balance transistors Q16 and Q17. The control voltage $V_B$ applied to terminal 84 allows adjustment of the operating point to anywhere between approximately 80% of $V_{DD}$ and $V_{SS}$. This variability of the operating point eliminates the circuit's dependency on the process parameters in establishing the operating point. By changing the DC bias applied to $V_B$ terminal 84, transistors Q16 and Q17 are turned on or off. The lower (i.e. more negative) the bias signal applied at terminal 84, the harder Q16 turns on (and the harder Q17 turns off). The opposite is true for a positive signal applied to terminal 84. By using $V_B$ to vary the current flowing through Q16, it is possible to cause more or less current to flow through Q11 and Q10, which can be used to compensate for the possible threshold and size variations of these transistors. This action will thus allow the DC level at node 71 to be adjusted to a desirable bias point during reset ($\Phi_{RS2}$ high).

Figure 4:
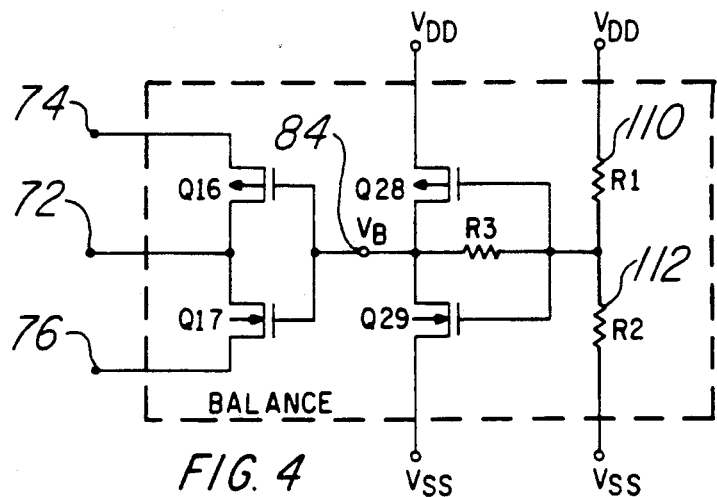
FIG. 4 is a schematic circuit diagram of a first modification to the first preferred embodiment amplifier of the present invention.

An automatic balance circuit may be added to the circuit of FIG. 3 which will allow the balance compensation to be implemented without external adjustments (a highly desirable feature in IC design). With reference to FIG. 4, transistors Q28 and Q29 form an inverting CMOS amplifier which amplifies the voltage generated by the resistors 110 and 112 and the amplifier internal reference. This amplified signal is then applied to $V_B$ terminal 84. Since the gain of this circuit can be adjusted by the resistor ratio R3/(R1 || R2), it is possible to arrive at a stable bias at the drains of transistors Q10 and Q11 independently of the device process variations.

The small feedback capacitor 82 ($C_f$) is provided to select the gain of the circuit of FIG. 3. The gain of the amplifier is determined by the ratio of $C_i/C_f$ as is well known from Op Amp theory. The $C_i$ term represents the coupling capacitance of the charge to the floating gate electrode in the charge detection node.

Capacitor 82 is short circuited during reset of the amplifier by CMOS switch Q24/Q25. A second reset pulse $\Phi_{RS2}$ is applied to terminal 104 and the gate of n-channel transistor Q25. Transistors Q26/Q27 form an invertor to provide an inverted $\Phi_{RS2}$ signal to the gate of p-channel transistor Q24.

The output of the input stage/balance circuit is passed through a dual stage buffer source follower circuit and presented to output terminal 92. This circuit provides buffering by supplying adequate driving capability for the external circuits connected to the output terminal 92.

Figure 5A:
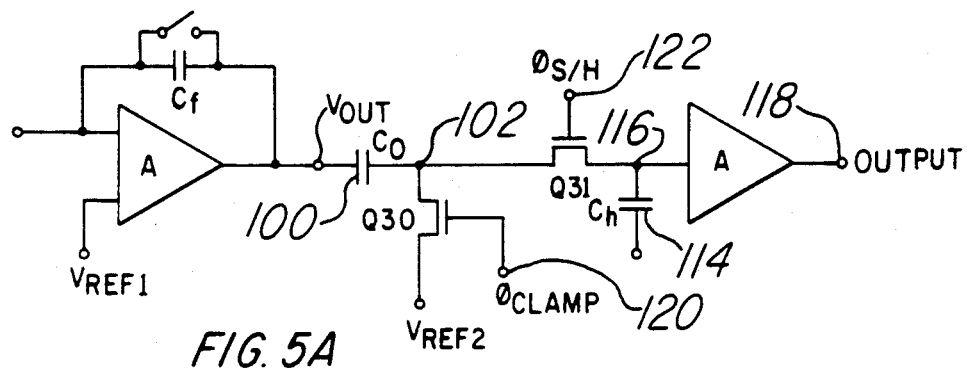
FIG. 5A is a schematic circuit diagram of the first preferred embodiment amplifier with a sample and hold circuit coupled to its output terminal.
Figure 5B:
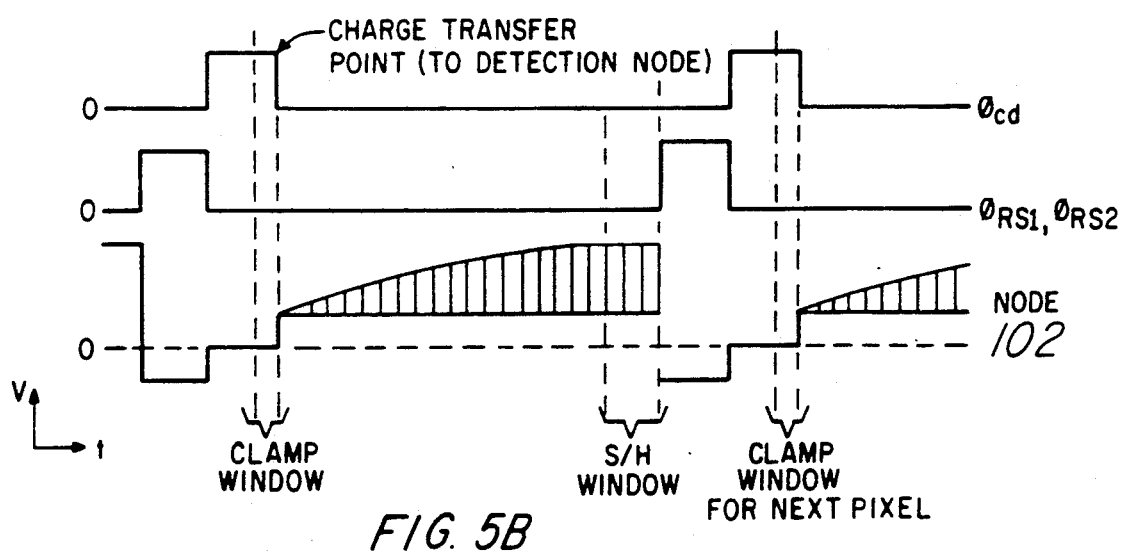
FIG. 5B is a timing diagram of the operation of the circuit of FIG. 5A.

Output terminal 92 may be connected to a clamp, sample and hold circuit through a coupling capacitor $C_o$ 100, as shown in FIG. 5A. Output node 102 of capacitor 100 is momentarily clamped to a reference voltage by the application of a clamping pulse $\Phi_{CLAMP}$ to the gate of transistor Q30. During the next cycle, the node 102 reaches its final potential, and a pulse $\Phi_{S/H}$ is applied to the gate of transistor Q31, transferring the signal at node 102 to node 116. FIG. 5B, when read with FIG. 2, shows the timing of the charge transfer into the detection node, the signal clamp, readout and hold, and the reset functions. Initially, a reset pulse is applied to lines $\Phi_{RS1}$ and $\Phi_{RS2}$ concurrently. The $\Phi_{RS2}$ pulse resets the amplifier, while the $\Phi_{RS1}$ pulse clears the charge from beneath floating gate 52 by removing the potential barrier that was previously impeding its flow. At the end of the pulse, a potential barrier is once again erected, forming a potential well underneath floating output gate 52. The amplifier reset pulse $\Phi_{RS2}$ causes some signal feedthrough and kTC fluctuation of the node 102. Next, the $\Phi_{cl}$ line is pulsed, causing the charge packets in the serial register to move and finally, after completion of the pulse, to transfer to the potential well under output gate 52. When the $\Phi_{cl}$ pulse is completed, the charge packet under output gate 52 is trapped between two potential barriers awaiting readout. Prior to this time, the clamp, sample and hold circuit clamps node 102 to a reference voltage. This results in establishing a new reference for a signal and removing the kTC noise fluctuation. After charge is transferred to the detection node, converted to a voltage signal and amplified, it appears as a voltage level on node 102. This signal is then transferred to node 116 with the application of a $\Phi_{S/H}$ pulse, amplified again (buffered) and presented to the output terminal 118 with the kTC noise fluctuations removed. At this point, the cycle repeats.

By using only a single stage inverting amplifier within the feedback loop, stability of the circuit is easily achieved. Multiple stages cause signal delay which requires feedback compensation, which in turn wastes power and causes instabilities. Operating bandwidth is also improved for the same reason.

A further feature of the amplifier is that the bias is set by the balance transistors Q16/Q17 during the reset operation. It is desirable to minimize feedthrough from the reset switch when it opens. This is achieved by a complementary arrangement of PMOS and NMOS transistors which cancels the feedthrough error (i.e. when the complementary reset signals leak through transistors Q24 and Q25 to capacitor $C_f$, they are of opposite polarity and cancel).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A charge detection amplifier circuit, comprising:
   an input terminal for receiving an input signal;
   an output terminal for impressing an amplification of said input signal;
   a single ended amplification stage coupled to said input terminal for amplifying said input signal;
   a balance circuit coupled to an output node of said single ended amplification stage and providing an additional bias current to said single ended amplification stage in response to a voltage applied to a balance circuit input terminal; and
   a buffer stage coupled to said output node of said single ended amplification stage for providing increased current driving capability to said output terminal.

2. The amplifier circuit of claim 1, further comprising a capacitive element coupled between said output node of said amplification stage and said input terminal for providing feedback.

3. The amplifier circuit of claim 2, further comprising a reset switch connected across said capacitive element.

4. The amplifier circuit of claim 1 wherein said amplification stage, said balance circuit, and said buffer stage are fabricated on the same semiconductor substrate.

5. The amplifier circuit of claim 1, wherein said amplification stage and said balance circuit are comprised of:
   a first transistor having a first gate coupled to said input terminal, a first source coupled to a first node, and a first drain coupled to said output node;
   a second transistor having a second gate coupled to said input terminal, a second drain coupled to said output node, and a second source coupled to a second node;
   a third transistor having a third gate coupled to said output node, a third source coupled to said first node, and a third drain coupled to a first voltage source;

a fourth transistor having a fourth gate coupled to said output node, a fourth source coupled to a second voltage source, and a fourth drain coupled to said second node;

a fifth transistor having a fifth gate coupled to said first voltage source, a fifth source coupled to said second voltage source, and a fifth drain coupled to said first node;

a sixth transistor having a sixth gate coupled to said second voltage source, a sixth drain coupled to said second node, and a sixth source coupled to said first voltage source;

a seventh transistor having a seventh gate coupled to said balance circuit input terminal, a seventh drain coupled to said first node, and a seventh source coupled to said output node; and an eighth transistor having an eighth gate coupled to said balance circuit input terminal, an eighth source coupled to said second node, and an eighth drain coupled to said output node.

6. The amplifier circuit of claim 1 wherein said buffer stage is a dual stage source follower circuit.

7. The amplifier circuit of claim 1 wherein said voltage applied to said balance circuit input terminal is internally generated within said balance circuit.

8. The amplifier circuit of claim 5 wherein all said transistors are CMOS transistors.

9. The amplifier circuit of claim 7, wherein said amplification stage and said balance circuit are comprised of:

a first transistor having a first gate coupled to said input terminal, a first source coupled to a first node, and a first drain coupled to said output node;

a second transistor having a second gate coupled to said input terminal, a second drain coupled to said output node, and a second source coupled to a second node;

a third transistor having a third gate coupled to said output node, a third source coupled to said first node, and a third drain coupled to a first voltage source;

a fourth transistor having a fourth gate coupled to said output node, a fourth source coupled to a second voltage source, and a fourth drain coupled to said second node;

a fifth transistor having a fifth gate coupled to said first voltage source, a fifth source coupled to said second voltage source, and a fifth drain coupled to said first node;

a sixth transistor having a sixth gate coupled to said second voltage source, a sixth drain coupled to said second node, and a sixth source coupled to said first voltage source;

a seventh transistor having a seventh gate coupled to a third node, a seventh drain coupled to said first node, and a seventh source coupled to said output node; and an eighth transistor having an eighth gate coupled to said third node, an eighth source coupled to said second node, and an eighth drain coupled to said output node.

a ninth transistor having a ninth gate coupled to a fourth node, a ninth source coupled to a second voltage source, and a ninth drain coupled to said third node;

a tenth transistor having a tenth gate coupled to said fourth node, a tenth source coupled to said first voltage source, and a tenth drain coupled to said third node;

a first resistor coupled between said fourth node and said second voltage source;

a second resistor coupled between said fourth node and said first voltage source; and a third resistor coupled between said third node and said fourth node.

10. A method for amplifying a signal from a charge detection node, comprising the steps of:

receiving an input signal from a charge detection node;

generating an output signal by amplifying said input signal with a single ended amplification stage;

balancing said single ended amplification stage by providing feedback of said output signal to change the bias of said single ended amplification stage in response to a control voltage present on a control terminal of a balance circuit;

buffering said output signal to provide increased current driving capability.

11. The method of claim 10 including the further step of generating said control voltage within said balance circuit.

12. The method of claim 10, including the further step of coupling a storage element across said amplification stage to provide feedback of said output signal to said input signal.

13. The method of claim 12, including the further step of coupling a reset switch across said capacitive element.

14. An image sensor including a charge detection amplifier wherein said amplifier comprises:

an input terminal for receiving an input signal;

an output terminal for impressing an amplification of said input signal;

a single ended amplification stage coupled to said input terminal for amplifying said input signal;

a balance circuit coupled to an output node of said single ended amplification stage and providing an additional bias current to said single ended amplification stage in response to a voltage applied to a balance circuit input terminal; and a buffer stage coupled to said output node of said single ended amplification stage for providing increased current driving capability to said output terminal.

* * * * *